United States Patent
Hasegawa et al.

(10) Patent No.: US 6,756,086 B2
(45) Date of Patent: Jun. 29, 2004

(54) METHOD FOR THE FABRICATION OF A DIAMOND SEMICONDUCTOR

(75) Inventors: Masataka Hasegawa, Tsukuba (JP); Masahiko Ogura, Tsukuba (JP); Daisuke Takeuchi, Tsukuba (JP); Hideyo Okushi, Tsukuba (JP); Naoto Kobayashi, Tsukuba (JP); Sadanori Yamanaka, Kawaguchi (JP)

(73) Assignees: Agency of Industrial Science and Technology, Ministry of International Trade and Industry, Tokyo (JP); Japan Science and Technology Corporation, Saitama (JP)

( * ) Notice: Subject to any disclaimer, the term of this patent is extended or adjusted under 35 U.S.C. 154(b) by 0 days.

(21) Appl. No.: 10/090,771

(22) Filed: Mar. 6, 2002

(65) Prior Publication Data

US 2002/0127405 A1 Sep. 12, 2002

Related U.S. Application Data

(62) Division of application No. 09/621,360, filed on Jul. 21, 2000, now abandoned.

(30) Foreign Application Priority Data

Jul. 21, 1999 (JP) .......................................... 11-206858

(51) Int. Cl.[7] .............................................. C23C 14/48
(52) U.S. Cl. ...................................... 427/523; 427/530
(58) Field of Search ................................. 427/523, 530

(56) References Cited

U.S. PATENT DOCUMENTS

| H001287 H | * | 2/1994 | Zeisse et al. | ................ | 257/410 |
| 5,328,855 A | * | 7/1994 | Kitabatake et al. | .......... | 438/105 |
| 5,653,800 A | * | 8/1997 | Kucherov et al. | ............. | 117/79 |
| 5,670,788 A | * | 9/1997 | Geis | .............................. | 257/10 |
| 6,281,037 B1 | * | 8/2001 | Heera et al. | ................. | 438/105 |
| 6,376,276 B1 | * | 4/2002 | Oishi et al. | .................. | 438/105 |

FOREIGN PATENT DOCUMENTS

| JP | 63-302516 | 12/1988 |
| JP | 05-097581 | 4/1993 |
| JP | 11-157990 | 6/1999 |

OTHER PUBLICATIONS

Hayashi, et al., "Diamond films epitaxially grown by step--flow mode" Journal of Crystal Growth 183 (1998) 338–346.

* cited by examiner

*Primary Examiner*—Bret Chen
(74) *Attorney, Agent, or Firm*—Oblon, Spivak, McClelland, Maier & Neustadt, P.C.

(57) ABSTRACT

A diamond semiconductor includes a high-quality thin diamond film layer with few crystal defects and few impurities, implanted with ions of dopant elements and controllable in conductivity determined by a kind and a concentration of the dopant elements. The diamond semiconductor is fabricated by a method including the step of implanting ions of dopant elements into a high-quality thin diamond film layer with few crystal defects and few impurities under conditions that can attain given distribution of concentrations of the dopant elements and with the high-quality thin diamond film layer kept to a temperature in accordance with the conditions so as not to be graphitized, to thereby enable the diamond semiconductor to have conductivity determined by a kind and a concentration of the dopant elements.

3 Claims, 4 Drawing Sheets

METHOD FOR THE FABRICATION OF A DIAMOND SEMICONDUCTOR

This application is a Division of application Ser. No. 09/621,360 filed on Jul. 21, 2000 now abandoned.

BACKGROUND OF THE INVENTION

1. Field of the Invention

The present invention relates to a diamond semiconductor expected to be developable as an electronic device manifesting various characteristics, such as high output, high stability in harsh environment, etc. and to a method for the fabrication thereof.

2. Description of the Prior Art

In recent years considerable attention has been focused on diamond, from the standpoint of its excellent physical properties, as a material for electronic devices capable of manifesting various characteristics such as high output, high speed, high frequency, low loss, high stability in harsh environment, etc. In order to realize the development as such electronic devices, it is necessary to establish a technology of controlling electrical conductivity (p-type or n-type) by addition of dopant elements. While various methods have been adopted for this conductivity-controlling technology, development of a conductivity-controlling technology according to the ion implantation method has been demanded in particular. There has been an increasing demand for the fabrication of diamond semiconductors according to the ion implantation method.

Various attempts have been made to fabricate diamond semiconductors using the ion implantation method. As dopant elements, various elements have been added. For example, an attempt has been made to fabricate a p-type diamond semiconductor by addition of boron.

Although it has been confirmed that a diamond semiconductor fabricated by addition of boron exhibits p-type conductivity, the diamond semiconductor cannot be put into practical use in terms of resistivity.

Another attempt has been made to fabricate an n-type diamond semiconductor by addition of phosphorus, lithium, etc. as dopant elements, using the ion implantation method. However, this attempt has not yet been succeeded in. Realization of this attempt is a subject matter in using diamond as the material for an electronic device.

The present invention has been accomplished in view of the above. An object of the present invention is to provide a diamond semiconductor controllable in conductivity by the ion implantation method and developable as an electronic device and a method for the fabrication thereof.

SUMMARY OF THE INVENTION

To attain the above object, the present invention provides a diamond semiconductor comprising a high-quality thin diamond film layer with few crystal defects and few impurities, implanted with ions of dopant elements and controllable in conductivity determined by a kind and a concentration of the dopant elements.

The high-quality thin diamond film layer with few crystal defects and few impurities includes a thin diamond film layer that can emit ultraviolet light at room temperature by excitation using electron beam irradiation when it has a thickness of not less than 200 nm.

The present invention further provides a method for the fabrication of a diamond semiconductor, comprising the step of implanting ions of dopant elements into a high-quality thin diamond film layer with few crystal defects and few impurities under conditions (implantation energy and implantation amount) that can attain given distribution of concentrations of the dopant elements and with the high-quality thin diamond film layer kept to a temperature in accordance with the conditions so as not to be graphitized, to thereby enable the diamond semiconductor to have conductivity determined by a kind and a concentration of the dopant elements.

The ion implantation conditions include implantation energy in the range of 10 keV to 1000 keV, an dopant element concentration in the range of $1 \times 10^{16}$ to $1 \times 10^{21}/cm^3$. Furthermore, the thin diamond film layer is maintained at a temperature of room temperature to 800° C. so as not to be graphitized at the ion implantation process.

When ions of an element serving as an n-type dopant are implanted into a high-quality thin diamond film layer, since the layer has few impurities and few crystal defects, electrons of the dopant element can be excited into a conduction band and move with ease. It is conceivable that this is why the diamond semiconductor of the present invention can have n-type conductivity. When ions of an element serving as a p-type dopant are implanted into a high-quality thin diamond film layer, since the layer has few impurities and few crystal defects, holes can excited into a valence band with ease and move freely. It is conceivable that this is why the diamond semiconductor of the present invention can have p-type conductivity.

The above and other objects, features and advantages of the present invention will become apparent from the description of the invention to be given herein below with reference to the accompanying drawings.

DESCRIPTION OF THE PREFERRED EMBODIMENT

The present invention will be described in detail with reference to one embodiment shown in the accompanying drawings. First, a thin diamond film layer that constitutes the main body of a diamond semiconductor according to the present invention using FIG. 1 and FIG. 2.

Figure 1:
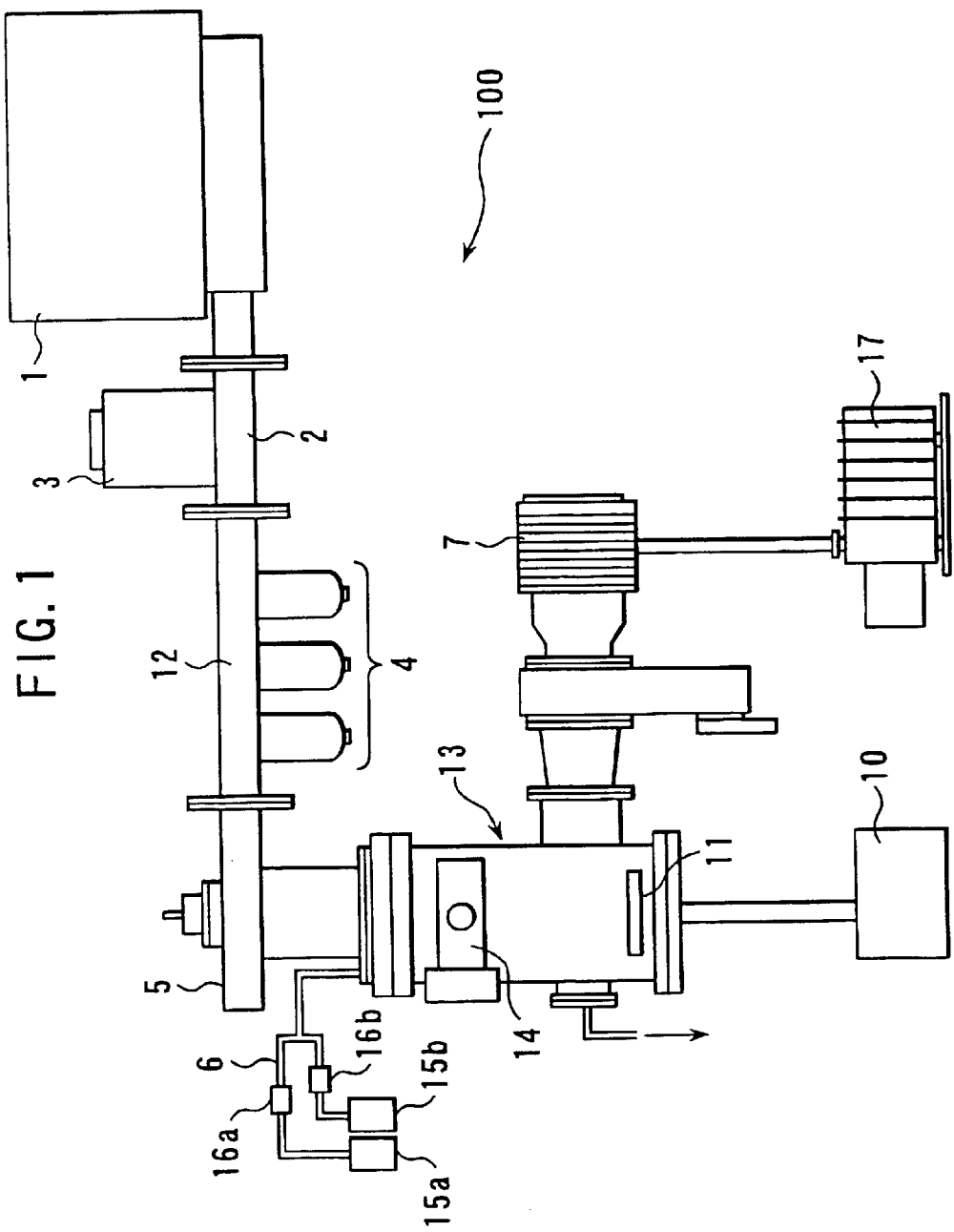
FIG. 1 is a schematic view showing one example of an apparatus for fabricating a thin diamond film layer that is the main body of a diamond semiconductor according to the present invention.

FIG. 1 shows one example of an apparatus for fabricating a thin diamond film layer. It is an end-launch-type microwave CVD diamond synthesizer 100 that projects microwaves normally to the surface of a substrate 11. A microwave source 1 has the maximum output of 1.5 kW and emits microwaves of 2.45 GHz under output adjustment. A circulator 2 and a dummy load 3 are provided downstream the microwave source 1. The microwaves emitted by the microwave source 1 are partially reflected back via a waveguide 12 toward the microwave source 1 to degrade an oscillator (not shown) of the microwave source 1. In order to prevent this degradation, the circulator 2 is adapted to heat-absorb only the reflected microwaves in a water load. A three-rod tuner 4 is provided downstream the circulator 2 for regulating the impedance of the waveguide 12 so as to suppress microwave reflection and enable all input electric power to be consumed for producing plasma. An applicator 5 having an antenna projecting into the waveguide 12 is provided downstream the tuner 5 for converting the TE10 mode microwaves advancing through the waveguide 12 into concentric TM01 mode microwaves. The matching of the microwaves by the conversion to TM01 mode produces a stable plasma in a cylindrical reaction chamber 13 provided with a sample door 14.

Raw gas is a mixed gas of methane gas (carbon source gas) and hydrogen gas that pass from gas cylinders 15a and 15b through pressure reducing valves (not shown) and mass flow controllers 16a and 16b into a gas inlet pipe 6 to be supplied to the reaction chamber 13. The mass flow controller 16a for the methane gas is a high-precision unit enabling the mixing ratio (the ratio of the methane gas to the hydrogen gas) to be regulated to not more than 0.6%.

A process pump (not shown) is operated to evacuate the interior of the reaction chamber 13 during the process of CVD diamond synthesis to maintain the interior in a considerably clean vacuum state. A plasma assisted diamond synthesis proceeds in that state. A turbo pump 7 is operated to obtain high vacuum in the preliminary evacuation, a rotary pump 17 is operated to evacuate the interior of the reaction chamber 13 during the synthesis, and a high-frequency heater 10 is operated to control the temperature of the substrate 11 in the reaction chamber 13.

Thin diamond film layers were fabricated in accordance with the method disclosed in JP-A 11-157990 using the aforementioned apparatus at a small methane gas concentration varying in the range of 0.016% to 2.0% and at an ordinary methane gas concentration of 6.0%. The thin diamond film layers thus fabricated were assayed for crystallinity using electron beam excitation cathode luminescence (CL).

Figure 2:
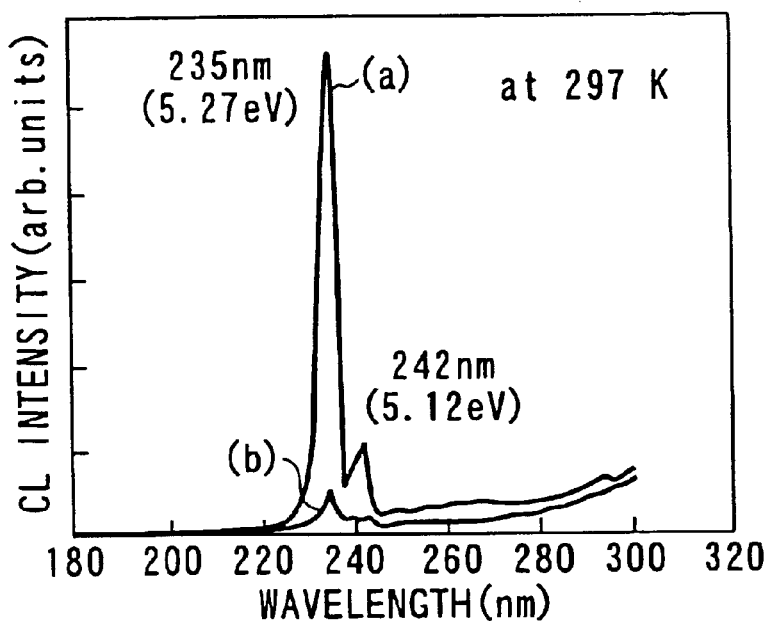
FIG. 2 is a diagram showing cathode luminescence (CL) spectra of thin diamond film layers fabricated using a low concentration of methane gas, obtained within the range of ultraviolet light.

FIG. 2 is a diagram showing CL spectra of thin diamond film layers fabricated by the apparatus, obtained within the range of ultraviolet light. In the diagram, (a) denotes a CL spectrum of the thin diamond film layer fabricated at a low methane gas concentration of 0.016% to 2.00%, e.g. 0.025%, and (b) denotes a CL spectrum of the thin diamond film layer fabricated at a methane gas concentration of 6.0%.

The diamond film layer having the CL spectrum (a) exhibits considerably large CL intensity at a wavelength of 235 nm. The emission at 235 nm is ultraviolet emission with 5.27 eV resulting from recombination of free exitons of diamond. The diamond film layer having the CL spectrum (a) exhibits at room temperature band-end emission that is peculiar to diamond, whereas that having the CL spectrum (b) exhibits little band-end emission because emission in the band gap is impeded by the appearance of recombination centers in the presence of impurities and crystal defects in the film layer. In view of this, it is found that thin diamond film layers fabricated at a low methane gas concentration are extremely excellent (high in quality).

The quality of the thin diamond film layer used as the main body of the diamond semiconductor in the present invention is so high as to emit ultraviolet light at room temperature as described above. However, there is a possibility of thin diamond film layers of the same high quality being observed not to emit ultraviolet light at room temperature if the layers have a thickness of not more than 200 nm. In the present embodiment, the high-quality thin diamond film layers too thin to emit ultraviolet light at room temperature under observation can also be used.

Although various attempts have been made to fabricate p-type and n-type diamond semiconductors by adding dopant elements to a thin diamond film layer using the ion implantation method, p-type diamond semiconductors fabricated by addition of boron have not had sufficient quality for an electronic device material, and fabrication of n-type diamond semiconductors has not yet been succeeded in, as described above. The principal reason for these that can be raised is that it has heretofore been impossible to obtain a high-quality thin diamond film layer exhibiting few crystal defects and containing few impurities.

It is conceivable that since conventional thin diamond film layers contain a large amount of impurities and have many crystal defects, elements serving as n-type dopants, even when added, cannot well emit electrons in the presence of the impurities and crystal defects, and electrons, if emitted, are prevented from moving (flowing) and therefore that the thin diamond layers cannot exhibit n-type conductivity. It is also conceivable that elements serving as p-type dopants, even when added, cannot well emit holes in the presence of impurities and crystal defects in conventional thin diamond film layers, and holes, if emitted, are prevented from moving (flowing) and therefore that the thin diamond layers cannot exhibit p-type conductivity.

The term "high-quality" used throughout the description means that in the electron beam excitation CL, emission at 430 nm as the center wavelength in the visible light wavelength region (called band A) is not observed, but free exciton recombination radiation (at 235 nm and 242 nm in the ultraviolet light region) can be observed at room temperature. In the present invention, the aforementioned problems have been solved by using thin diamond film layers of this high-quality, and diamond semiconductors of p-type conductivity and n-type conductivity determined by dopant elements to be added have been fabricated by implanting the ions of the dopant elements into the high-quality thin diamond film layers. One example of fabricating such a high-quality thin diamond film layer is as described above.

In fabricating n-type diamond semiconductors using the ion implantation method, a concrete example of using sulfur as an dopant element will be described. Sulfur ion implantation conditions are shown in Table 1 below.

TABLE 1

Sulfur Ion ($S^+$) Implantation Conditions

| Implantation Energy (keV) | Implantation Amount ($cm^{-2}$) |
|---|---|
| 30 | $3.18 \times 10^{14}$ |
| 50 | $3.92 \times 10^{14}$ |
| 75 | $3.74 \times 10^{14}$ |
| 100 | $7.20 \times 10^{14}$ |
| 150 | $9.11 \times 10^{14}$ |
| 200 | $8.21 \times 10^{14}$ |
| 250 | $1.07 \times 10^{15}$ |
| 300 | $5.17 \times 10^{15}$ |
| 350 | $1.37 \times 10^{15}$ |
| 400 | $1.33 \times 10^{15}$ |

In this example, sulfur ions were implanted under multi-stage energy into thin diamond film layers maintained at a temperature of 400° C. For example, the amount of sulfur ions implanted under 30 keV was $3.18\times10^{14}/cm^2$ that under 100 keV was $7.20\times10^{14}/cm^2$ and that under 400 keV was $1.33\times10^{15}/cm^2$ as shown in Table 1 above.

Figure 3:
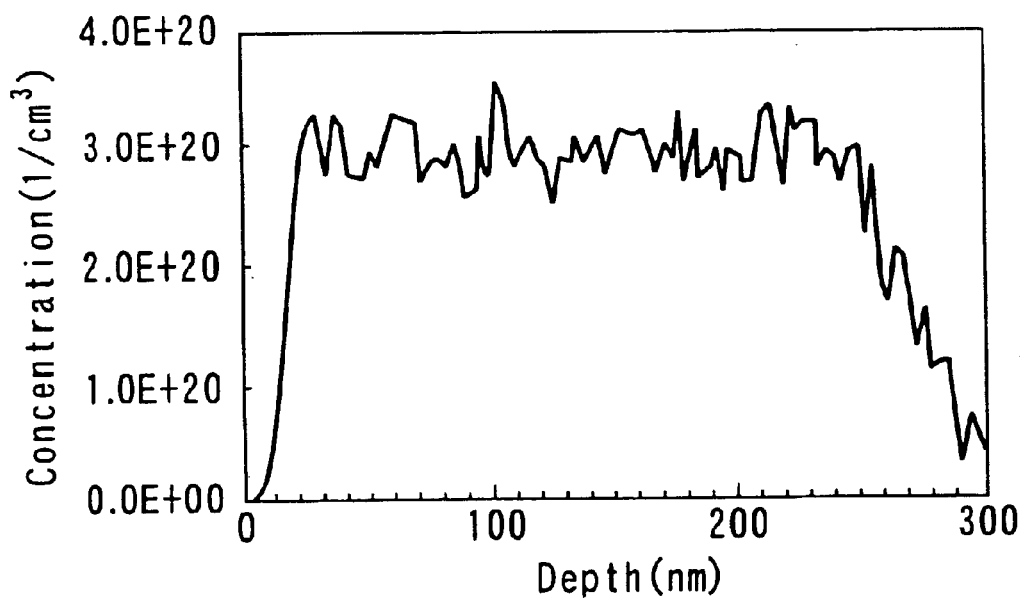
FIG. 3 is a diagram showing depth-direction distribution of the dopant concentration in a thin diamond film layer implanted with sulfur ions under the conditions in Table 1.
Figure 4:
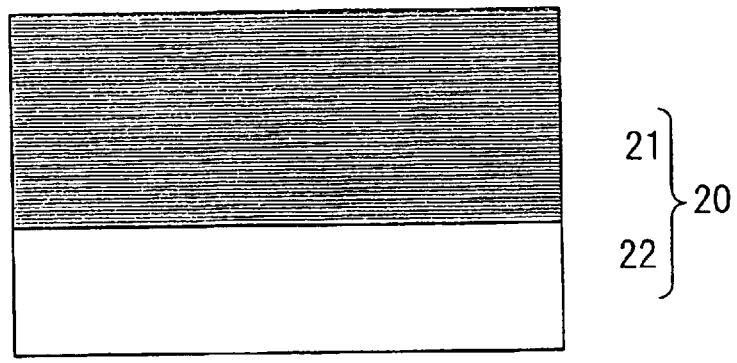
FIG. 4 is a schematic view showing the cross section of a thin diamond film layer implanted with sulfur ions.

FIG. 3 is a diagram showing depth-direction distribution of the dopant concentration in a thin diamond film layer implanted with sulfur ions under the conditions in Table 1, and FIG. 4 is a schematic view showing the cross section of the thin diamond film layer. As shown in these figures, use of the multistage implantation energy of 30 keV to 400 keV enabled fabrication of an n-type diamond semiconductor 20 comprising an n-type diamond semiconductor layer 21 added with sulfur in the amount of about $3.0\times10^{20}/cm^3$ in the region just from the neighborhood of the surface to the depth of 250 nm, and a high-quality thin diamond film layer 22 remaining intact without being added with sulfur.

Figure 5:
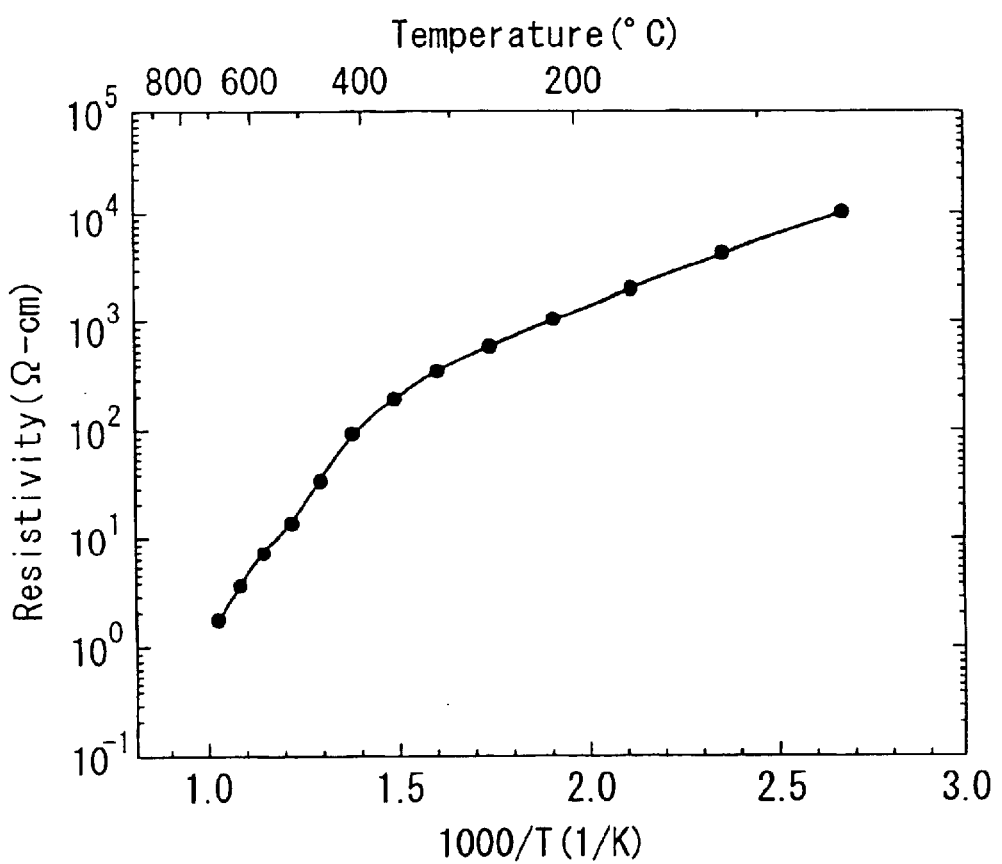
FIG. 5 is a graph showing temperature dependency of the resistivity of an n-type diamond semiconductor fabricated by implantation of sulfur ions.
Figure 6:
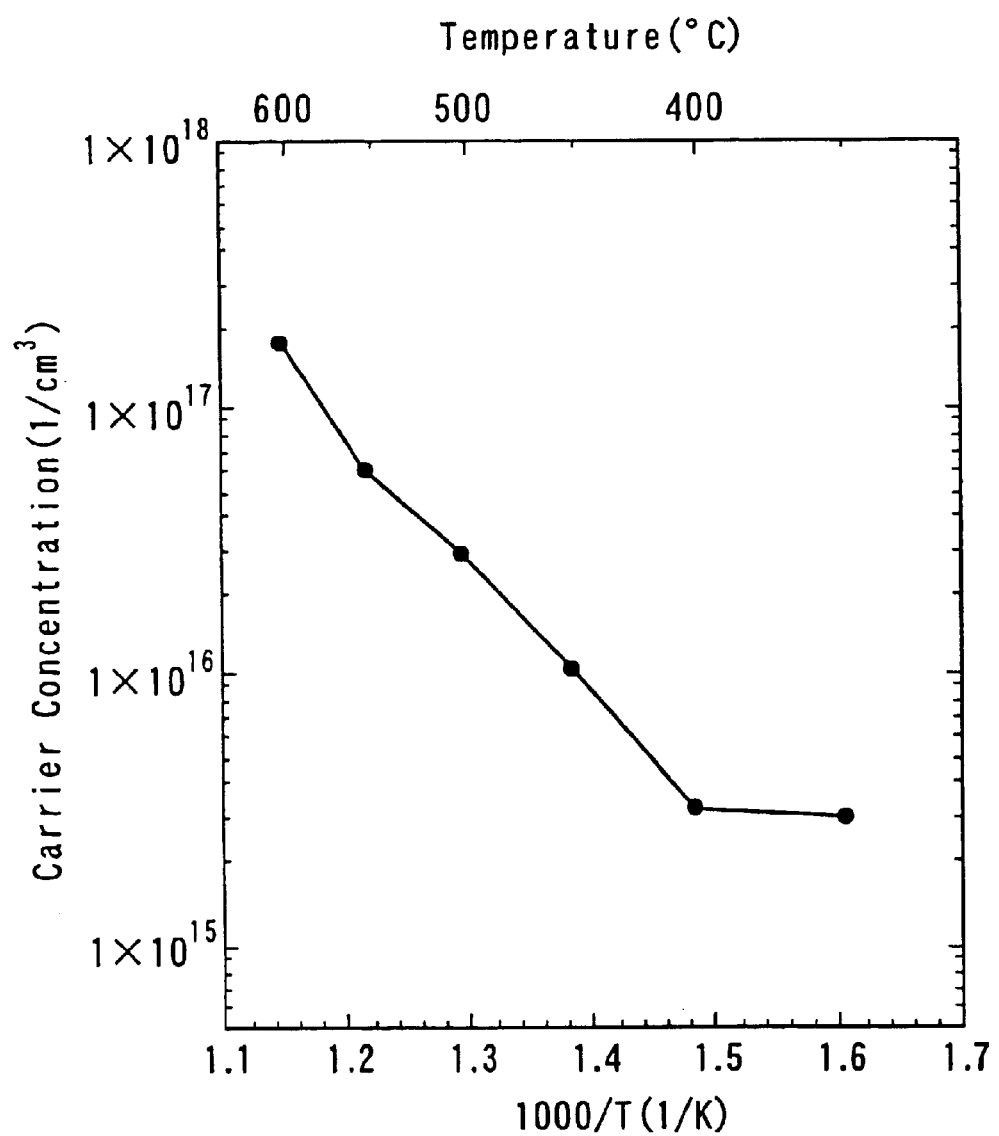
FIG. 6 is a graph showing temperature dependency of the carrier concentration of an n-type diamond semiconductor fabricated by implantation of sulfur ions.

The n-type diamond semiconductor 20 was provided with ohmic electrodes and measured in terms of its resistivity ρ. FIG. 5 is a graph showing the temperature dependency of the resistivity ρ, in which the lateral axis stands for the inverse number of temperature and the vertical axis for the resistivity ρ. As shown, the resistivity decreases like an exponential function in proportion as the inverse number of temperature decreases. This proves the diamond semiconductor 20 to be undoubtedly a semiconductor. The Hall effect was further measured to directly find whether the carriers generated in the diamond semiconductor 20 were electrons or holes. The diamond semiconductor 20 is of an n-type if the carriers are electrons or of a p-type if the carriers are holes. In the measurement of the Hall effect at temperatures of less than 350° C., it was impossible to determine that the carriers were electrons or holes. However, the measurement of the Hall effect at temperatures of not less than 350° C. revealed that the carriers were electrons. This proves that the diamond semiconductor 20 is of an n-type. FIG. 6 is a graph showing the temperature dependency of the concentration of the generated carriers (electrons), in which the lateral axis stands for the inverse number of temperature and the vertical axis for the carrier concentration. As shown, the carrier concentration increases like an exponential function in proportion as the inverse number of temperature decreases. This also proves the diamond semiconductor 20 to be undoubtedly a semiconductor.

When ions are implanted into a thin diamond film layer, there is a case where transition from the diamond phase to a graphite phase is induced in the ion-implanted region. Induction of this phase transition depends on the temperature of the thin diamond film layer and the ion implantation amount. In view of this, the aforementioned example suppresses to the minimum the transition from the diamond phase to the graphite phase using the conditions shown in Table 1 and the maintaining temperature of 400° C. The maintaining temperature of 400° C. enables graphitization by sulfur ion implantation to be sufficiently avoided under the conditions of Table 1. The maximum amount of sulfur ions capable of being implanted into a thin diamond film layer maintained at 400° C. without graphitizing the film layer is five times that shown in Table 1 under each implantation energy. The maximum ion implantation amount varies depending on the temperature at which a thin diamond film layer is maintained. In this example, the ion implantation amount is less than the maximum. It goes without saying that the ion implantation amount is small, e.g. $1.0\times10^{19}/cm^3$, the thin diamond film layer is not graphitized even at room temperature.

While in the foregoing an n-type diamond semiconductor is fabricated by the ion implantation method using sulfur (Group VI) as the dopant element, phosphorus (Group V), lithium (Group I), bromine (Group VII), iodine (Group VII) and the like can also be used in fabricating n-type diamond semiconductors. In fabricating p-type diamond semiconductors, boron (Group III), silicon (Group IV) and the like can be used as the dopant elements. Almost all Group elements can be used as the dopant elements, and it is possible to control conductivity to that corresponding to the dopant element. The dopant element can be used singly or in combination.

Under the general implantation conditions of the ions of these various dopant elements, the implantation energy is in the range of 10 keV to 1000 keV and the implantation amount is in the range of $1\times10^{16}$ to $1\times10^{21}/cm^3$. In order to avoid graphitization of a thin diamond film layer, however, the film layer when implanted with ions has to be maintained at temperatures of room temperature to 800° C. varying depending on the ion implantation amount. In proportion as dopant elements are heavy, implantation energy is increased to have the same distribution as a light dopant element, or a temperature at which a thin diamond film layer is to be maintained is raised to suppress transition to a graphite phase to the minimum.

As has been described in the foregoing, the present invention makes it possible to provide a diamond semiconductor controllable in conductivity and a method for the fabrication thereof that have not heretofore been accomplished. The diamond semiconductor has quality enabling application to electronic devices and fabrication of p-n junctions, transistors, parts of power electronics, etc. Thus, it is possible to provide electronic devices capable of sufficiently manifesting various characteristics such as high output, high speed, high frequency, low loss, high stability in harsh environment, etc. based on the excellent physical properties peculiar to diamond. Furthermore, when the diamond semiconductor is used as an ultraviolet LED, it enables applications to parts of high-density light transmission, high-density storage media, or other such parts and media at short wavelengths.

What is claimed is:

1. A method for fabrication of a diamond semiconductor, comprising:

while heating a thin diamond film layer of a quality high enough to emit ultraviolet light at room temperature by excitation using electron beam irradiation when it has a thickness of not less than 200 nm, which thin diamond film layer is formed at a methane gas-to-hydrogen gas concentration of 0.016 to 2.0%, implanting ions of dopant elements into the thin diamond film layer in an ion implantation amount less than a maximum ion implantation amount that varies depending on a temperature at which the thin diamond film layer is maintained without being graphitized, wherein the diamond semiconductor thus fabricated exhibits conductivity determined by a kind and a concentration of the dopant elements.

2. The method according to claim 1, wherein the ions of dopant elements are implanted into the thin diamond film layer under implantation energy in a range of from 10 keV to 1000 keV, and an ion implantation amount in a range of $1\times10^{16}$ to $1\times10^{21}/cm^3$.

3. The method according to claim 1, wherein the temperature at which the thin diamond film layer is maintained is in a range of room temperature to 800° C.

* * * * *